US011245609B2

(12) United States Patent
Coupal et al.

(10) Patent No.: US 11,245,609 B2
(45) Date of Patent: Feb. 8, 2022

(54) CALIBRATING NETWORK ANALYZER DEVICES

(71) Applicants: VIAVI Solutions Inc., San Jose, CA (US); Dominic Coupal, Brossard (CA); Scott Baxter, San Jose, CA (US); Fei Chen, Shanghai (CN); Linda Huang, Shanghai (CN)

(72) Inventors: Dominic Coupal, Brossard (CA); Scott Baxter, San Jose, CA (US); Fei Chen, Shanghai (CN); Linda Huang, Shanghai (CN)

(73) Assignee: VIAVI Solutions Inc., San Jose, CA (US)

( * ) Notice: Subject to any disclaimer, the term of this patent is extended or adjusted under 35 U.S.C. 154(b) by 106 days.

(21) Appl. No.: 16/754,694

(22) PCT Filed: Oct. 9, 2017

(86) PCT No.: PCT/CN2017/105416
§ 371 (c)(1),
(2) Date: Apr. 8, 2020

(87) PCT Pub. No.: WO2019/071397
PCT Pub. Date: Apr. 18, 2019

(65) Prior Publication Data
US 2020/0244563 A1 Jul. 30, 2020

(51) Int. Cl.
*H04L 12/26* (2006.01)
*H04L 25/03* (2006.01)

(52) U.S. Cl.
CPC ........ *H04L 43/18* (2013.01); *H04L 25/03878* (2013.01)

(58) Field of Classification Search
CPC ................. H04L 43/18; H04L 25/03878
(Continued)

(56) References Cited

U.S. PATENT DOCUMENTS

2005/0060598 A1\* 3/2005 Klotz ............. G06F 11/2257
714/4.2
2008/0018343 A1\* 1/2008 Hayden ............. G01D 18/00
324/601
(Continued)

FOREIGN PATENT DOCUMENTS

GN 1815980 A 8/2006
WO 2009038947 A1 3/2009

OTHER PUBLICATIONS

International Search Report and Written Opinion—PCT/CN2017/105416—ISA/CN—dated May 16, 2018.

*Primary Examiner* — James E Springer
(74) *Attorney, Agent, or Firm* — Harrity & Harrity, LLP

(57) ABSTRACT

A device receives network information from an analyzer device associated with a host device, a target device, and a link of a network, and compares the network information and historical equalizer calibration information to identify a set of equalizer calibration information. The historical equalizer calibration information is associated with multiple host devices, multiple target devices, and multiple links. The device ranks the set of equalizer calibration information, based on quality information associated with the historical equalizer calibration information, to generate a ranked set of equalizer calibration information. The device provides the ranked set of equalizer calibration information to the analyzer device to permit the analyzer device to identify selected equalizer calibration information of the ranked set of equalizer calibration information, and utilize the selected equalizer calibration information.

23 Claims, 10 Drawing Sheets

(58) Field of Classification Search
USPC .......................................................... 709/224
See application file for complete search history.

(56) References Cited

U.S. PATENT DOCUMENTS

| | | | |
|---|---|---|---|
| 2009/0072845 A1* | 3/2009 | McCoy | G01R 31/2801 324/757.02 |
| 2013/0227689 A1* | 8/2013 | Pietrowicz | H04L 41/12 726/23 |
| 2014/0207530 A1 | 7/2014 | Seese et al. | |
| 2018/0048535 A1* | 2/2018 | Leibfritz | G01R 35/005 |

* cited by examiner

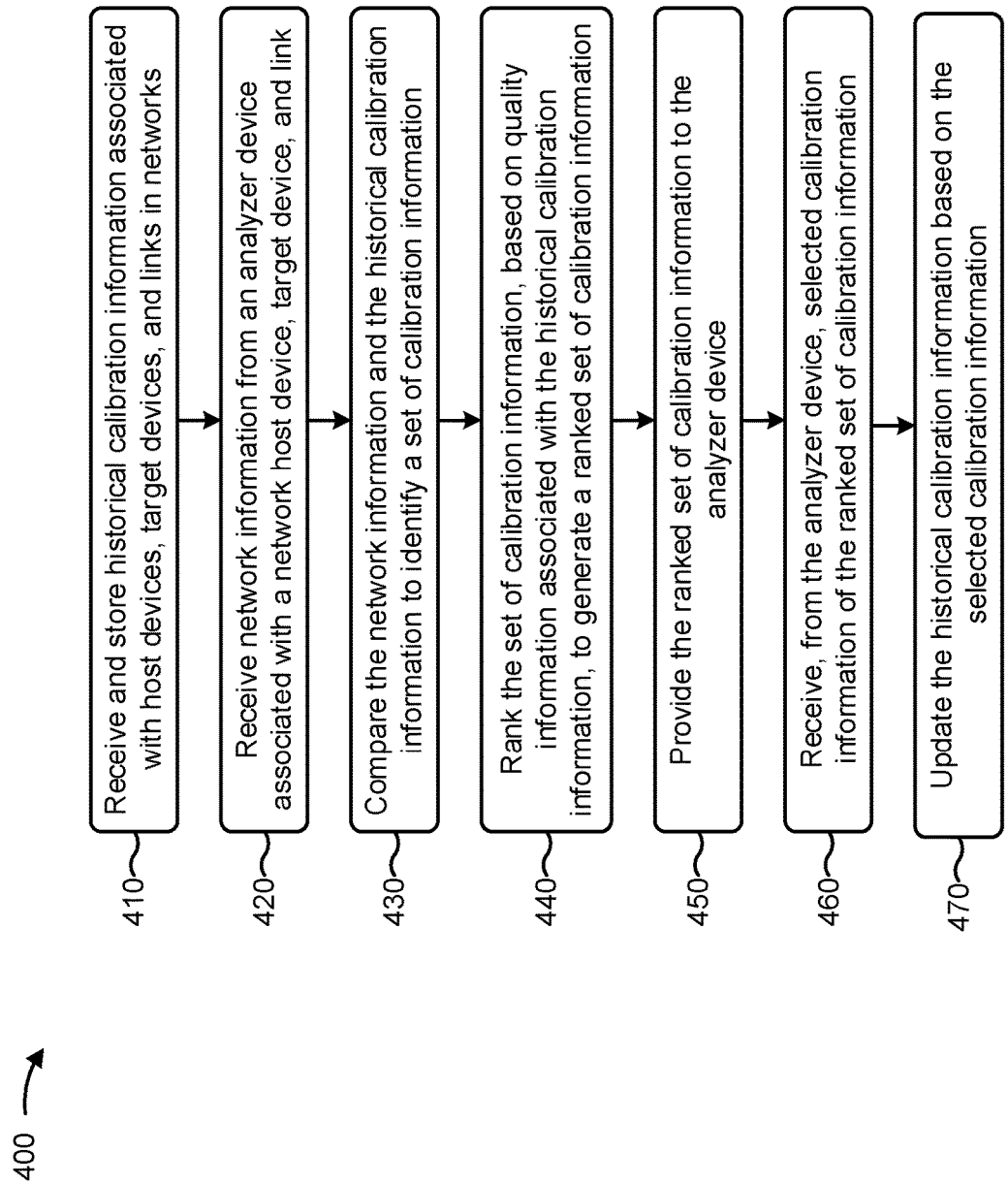

CALIBRATING NETWORK ANALYZER DEVICES

CROSS-REFERENCE TO RELATED APPLICATION

This application is a 371 national stage of PCT Application No. PCT/CN2017/105416 filed on Oct. 9, 2017, entitled "CALIBRATING NETWORK ANALYZER DEVICES." This related application is incorporated by reference herein.

BACKGROUND

A network analyzer device may be used to analyze and modify bi-directional link traffic (e.g., provided on optical links, wired links, buses, wireless links, and/or the like) between endpoint devices (e.g., host devices, target devices, routers, switches, gateways, modems, and/or the like).

SUMMARY

According to some possible implementations, a device includes one or more processors to: receive network information from an analyzer device associated with a host device, a target device, and a link of a network; compare the network information and historical equalizer calibration information to identify a set of equalizer calibration information, the historical equalizer calibration information being associated with a plurality of host devices, a plurality of target devices, and a plurality of links; rank the set of equalizer calibration information, based on quality information associated with the historical equalizer calibration information, to generate a ranked set of equalizer calibration information; and provide the ranked set of equalizer calibration information to the analyzer device to permit the analyzer device to identify selected equalizer calibration information of the ranked set of equalizer calibration information, and utilize the selected equalizer calibration information.

According to some possible implementations, a non-transitory computer-readable medium stores instructions that include: one or more instructions that, when executed by one or more processors, cause the one or more processors to: receive network information from an analyzer device associated with a host device, a target device, and a link of a network; compare the network information and historical equalizer calibration information to identify a set of equalizer calibration information, the historical equalizer calibration information being associated with a plurality of host devices, a plurality of target devices, and a plurality of links; rank the set of equalizer calibration information, based on quality information associated with the historical equalizer calibration information, to generate a ranked set of equalizer calibration information; and provide the ranked set of equalizer calibration information to the analyzer device to permit the analyzer device to identify selected equalizer calibration information of the ranked set of equalizer calibration information, and utilize the selected equalizer calibration information.

According to some possible implementations, a method includes: receiving, by a device, network information from an analyzer device associated with a host device, a target device, and a link of a network; comparing, by the device, the network information and historical equalizer calibration information to identify a set of equalizer calibration information, the historical equalizer calibration information being associated with a plurality of host devices, a plurality of target devices, and a plurality of links; ranking, by the device, the set of equalizer calibration information, based on quality information associated with the historical equalizer calibration information, to generate a ranked set of equalizer calibration information; and providing, by the device, the ranked set of equalizer calibration information to the analyzer device to permit the analyzer device to identify selected equalizer calibration information of the ranked set of equalizer calibration information, and utilize the selected equalizer calibration information.

BRIEF DESCRIPTION OF THE DRAWINGS

FIG. 4 is a flow chart of an example process for calibrating network analyzer devices.

DETAILED DESCRIPTION

Figure 1A:
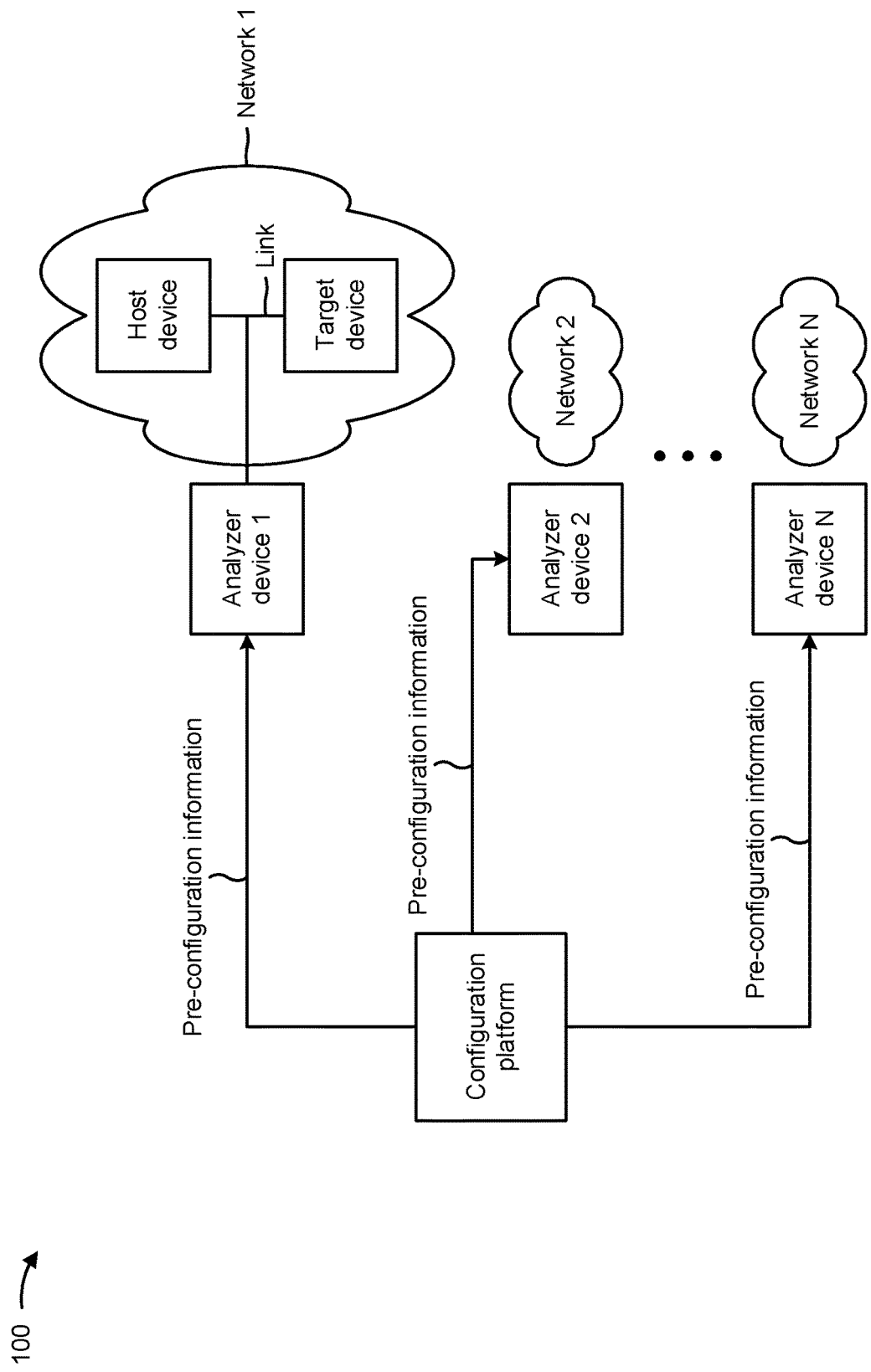
FIGS. 1A-1G are diagrams of an overview of an example implementation described herein.

The following detailed description of example implementations refers to the accompanying drawings. The same reference numbers in different drawings may identify the same or similar elements.

An analyzer device may be inserted on a link that connects two endpoint devices (e.g., a host device, a target device, a switch, and/or the like) of a network. The analyzer device may need to be calibrated depending on the end points in order to have an error-free link and to properly read, modify, and forward traffic in each direction of the link. In order to calibrate the analyzer device, a list of calibration information (e.g., calibration parameters or presets) associated with a first side of the link (the host device side) and a list of calibration information associated with a second side (the target device side) may be provided for display to a user of the analyzer device. The user may select from the lists of calibration information in order to calibrate the analyzer device in both directions. However, the selection from the lists of calibration information is a trial-and-error process that is both tedious and time consuming for the user. For example, whenever a calibration preset is selected or changed, the link may have to be fully re-initialized through a reboot of the host device and the target device in order to determine whether the endpoint devices properly function based on the selected calibration preset.

The calibration information may include equalization or equalizer information, such as equalization or equalizer presets. When inserting an analyzer device in the middle of a link, equalization calibration may be needed depending on the end points and the physical connection between the end points. The equalization presets are used with the analyzer device since the analyzer device is an adaptive equalizer that utilizes adaptive channel equalization to automatically adapt to time-varying properties of a communication channel (e.g., the link). An adaptive equalizer may be used with coherent modulations, such as phase shift keying, mitigating effects of multipath propagation, Doppler spreading, and/or the like. The purpose of adaptive channel equalization is to compensate for signal distortion in a communication channel (e.g., the link). Communication systems transmit a signal from one point (e.g., the host device) to another point (e.g., the target device) across a communication channel (e.g., the link). During the transmission process, the signal that contains information might become distorted. To compensate for this distortion, an analyzer device can apply an adaptive filter to the communication channel. The adaptive filter works as an adaptive channel equalizer.

Issues arise when the equalization presets of the analyzer device do not match the equalization presets associated with the host device and the target device. For example, when the equalization presets of the analyzer device do not match the equalization presets associated with the host device and the target device, the analyzer device causes in-line interference with the communications provided on the link and is unable to retrieve usable data from the link.

Some implementations, described herein, provide a calibration platform that calibrates network analyzer devices quickly and easily based on historical calibration information (e.g., historical equalizer calibration information, such as equalization presets). The calibration platform may receive calibration information from analyzer devices associated with different host devices, target devices, and link configurations, and may store the received information as historical calibration information. For a given host device and target device combination, the calibration platform may utilize the historical calibration information to provide ranked calibration information to an analyzer device so that the analyzer device can be calibrated using the best calibration information from history. The calibration platform provides the analyzer device with exact equalization presets used by the target device and the host device, so that analyzer device does not cause in-line interference with the communications provided on the link and is able to retrieve usable data from the link.

The term "calibration information," as used herein, may be used interchangeably with the terms "equalization information," "equalizer information," "equalization calibration information," "equalizer calibration information," "equalization presets," "equalizer presets," and/or the like.

FIGS. 1A-1G are diagrams of an overview of an example implementation 100 described herein. As shown in FIG. 1A, a configuration platform may communicate with analyzer devices (e.g., analyzer device 1, analyzer device 2, . . . , analyzer device N, where N>1) associated with corresponding networks (e.g., network 1, network 2, . . . , network N). In some implementations, multiple analyzer devices may be associated with a single network, but FIGS. 1A-1G show each analyzer device being associated with a respective network for simplicity. As further shown in FIG. 1A, each analyzer device may be coupled to a link provided between a host device and a target device of the network, so that the analyzer device may be able to read, forward, and modify the bi-directional traffic on an error-free link between the host device and the target device.

Assume that each analyzer device needs to be calibrated in order to read, forward, and modify the bi-directional traffic on an error-free link, and the calibration is dependent on first side characteristics (the host device side) and second side characteristics (the target device side). Further assume that the configuration platform includes pre-configuration information associated with calibrating the analyzer. In some implementations, the pre-configuration information may include information associated with the link (e.g., a type of link, a length of the link, a bandwidth of the link, and/or the like), information associated with the first side (e.g., a type of host device, an identifier of the host device, a capability of the host device, and/or the like), and information associated with the second side (e.g., a type of target device, an identifier of the target device, a capability of the target device, and/or the like). In one example, the pre-configuration information may include calibration information associated with the link, the host device, and the target device, and that may be used by the analyzer devices. In some implementations, the configuration platform may be pre-populated with the pre-configuration information (e.g., calibration parameters for host devices, target devices, and links, statistics for the calibration parameters, and/or the like). In this case, particular manufacturers of particular host devices and/or target devices may perform calibrations associated with the particular host devices and/or target devices to generate pre-configuration information, and may provide the pre-configuration information to the configuration platform.

In some implementations, and as further shown in FIG. 1A, the configuration platform may provide the pre-configuration information to the analyzer devices. In this way, the configuration platform may reduce an amount of calibration required for at least some of the analyzer devices (e.g., analyzer devices associated with the particular host devices and/or target devices for which the pre-configuration information is generated), which conserves processing resources of the analyzer devices. In example implementation 100, however, it is assumed that the analyzer devices are unable to utilize the pre-configuration information for calibration purposes.

Figure 1B:
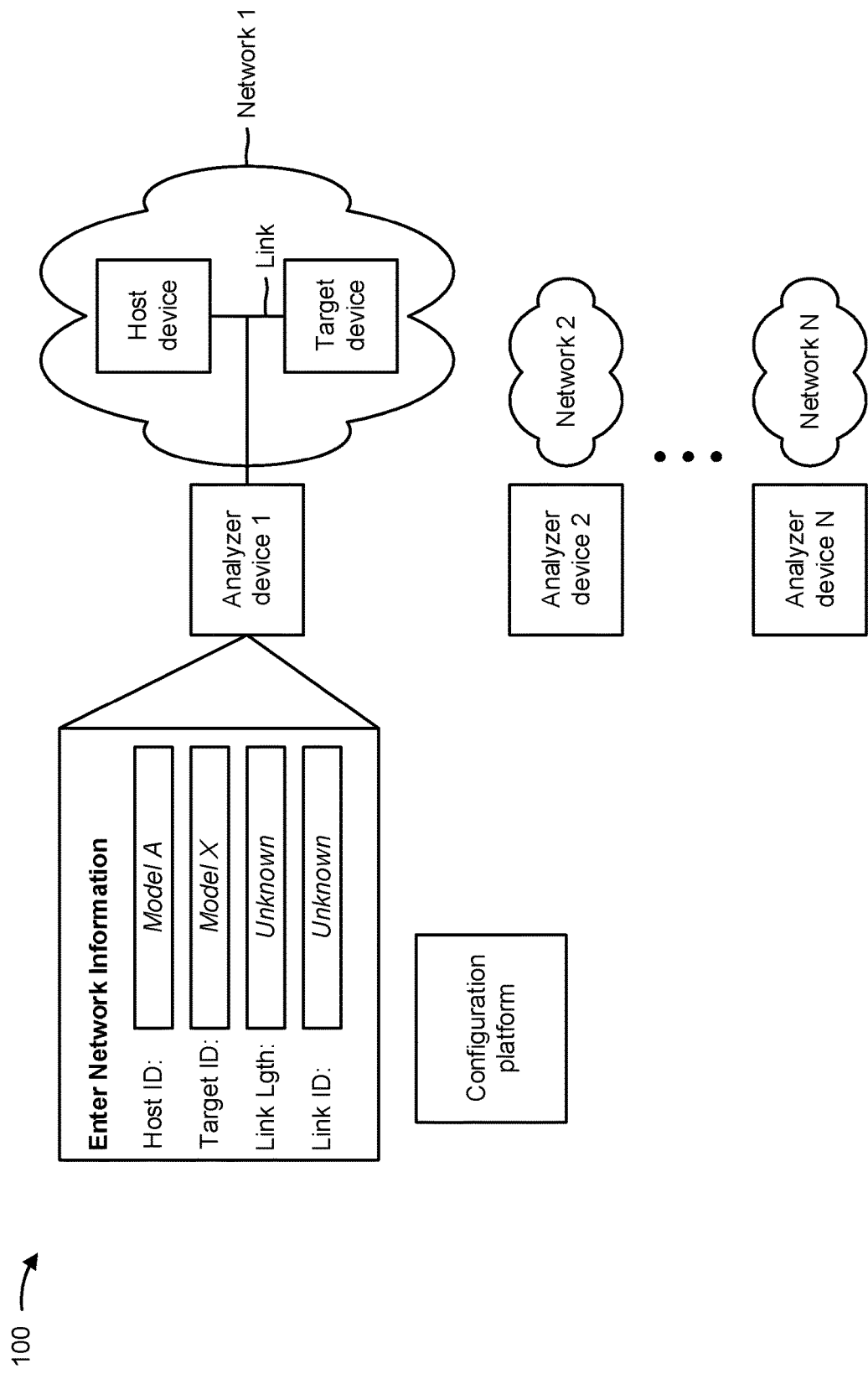

As shown in FIG. 1B, assume that a user of analyzer device 1 wishes to input network information (e.g., link equalization quality and end point information) associated with network 1 into analyzer device 1. In such a situation, analyzer device 1 may provide, for display, a user interface that enables the user to input identification information associated with the host device (e.g., a model number, a model type, a serial number, and/or the like), identification information associated with the target device (e.g., a model number, a model type, a serial number, and/or the like), a length of the link, identification information associated with the link (e.g., a link type, a link identifier, and/or the like), and/or the like. The network information (e.g., the identification information associated with the host device, the identification information associated with the target device, the length of the link, and the identification information associated with the link) may also be referred to as a link model. Further assume that network information is provided for the other analyzer devices (e.g., analyzer device 2, . . . , analyzer N) in a similar manner.

In some implementations, the user interface may include selection mechanisms (e.g., lists, menus, drop-down menus, and/or the like) for selecting the network information associated with the host device, the target device, and the link. For example, the user interface may include a first drop-down menu from which the user may select information identifying the host device, a second drop-down menu from which the user may select information identifying the target device, a third drop-down menu from which the user may select information identifying the link, and/or the like.

In some implementations, as shown in FIG. 1B, the user may input, via the user interface, some or all of the information associated with the link model. For example, the user may input a model identifier (e.g., Model A) for the host device and a model identifier (e.g., Model X) for the target device, but may not input information for the link. In such situations, the information for the link may be unknown to the user. In other examples, information associated with the host device and/or the target device may be unknown to the user. In some implementations, when the analyzer device provides a portion of the information associated with the link model or none of the information associated with the link model, the configuration platform may provide, to the analyzer device, calibration information associated with the most popular (e.g., highest ranked) one or more link models, as described elsewhere herein.

Figure 1C:
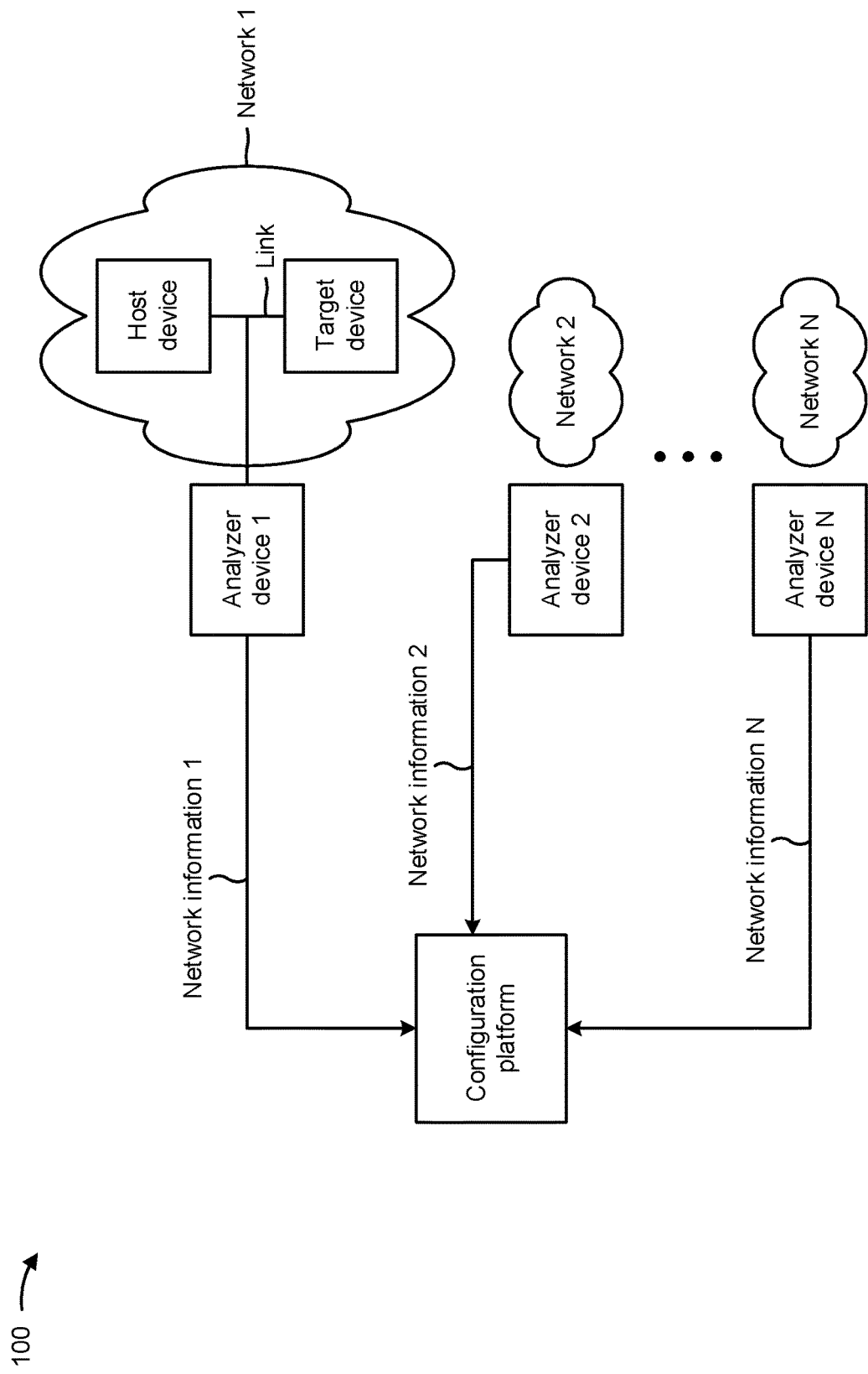

As shown in FIG. 1C, the analyzer devices may provide network information to the configuration platform, and the configuration platform may receive the network information. For example, analyzer device 1 may provide network information 1, which includes the identification information associated with the host device, the target device, and the link to the configuration platform. Analyzer device 2, . . . , analyzer device N may provide network information 2, . . . , network information N to the configuration platform, and network information 2, . . . , network information N may include similar information as network information 1.

Figure 1D:
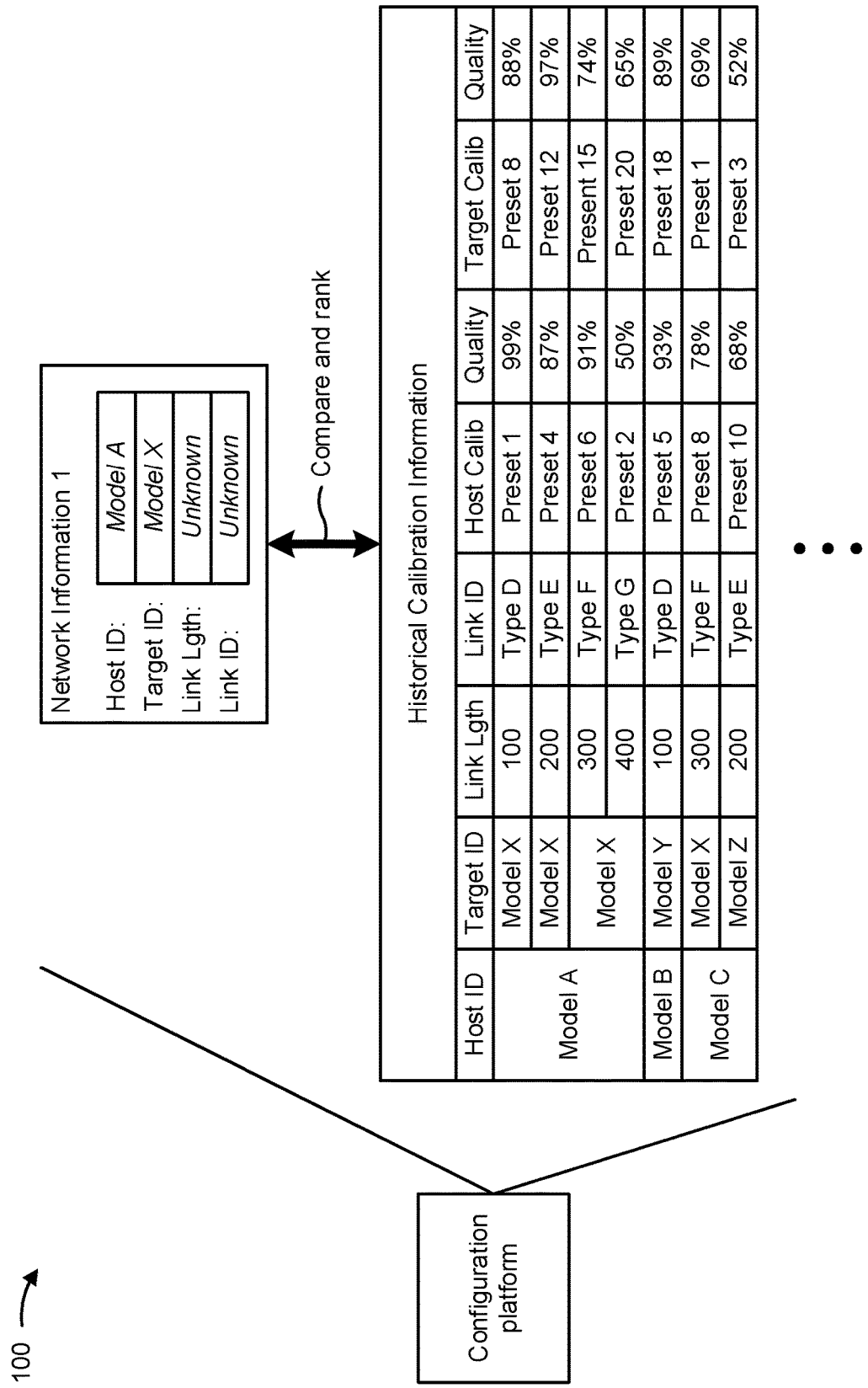

As shown in FIG. 1D, the configuration platform may include historical calibration information that is received from a variety of sources. In some implementations, the historical calibration information may be received from manufacturers associated with the host devices, the target devices, the links, and/or the like of the networks. In some implementations, the historical calibration information may be received from analyzer devices other than the analyzer devices depicted in FIGS. 1A-1G (e.g., analyzer devices different from the analyzer devices to be calibrated). In some implementations, the historical calibration information may be received from operator(s) of the configuration platform based on tests performed on the host devices, the target devices, the links, and/or the like by the operator(s) of the configuration platform.

As further shown in FIG. 1D, the historical calibration information may include identification information associated with host devices (e.g., Host ID), identification information associated with target devices (e.g., Target ID), lengths of links (e.g., Link Lgth), identification information associated with links (e.g., Link ID), host device calibration parameters or presets (e.g., Host Calib), quality indicators associated with the host device calibration parameters (e.g., Quality), target device calibration parameters or presets (e.g., Target Calib), quality indicators associated with the target device calibration parameters (e.g., Quality), and/or the like. By accumulating the historical calibration information for numerous combinations of host devices, target devices, and links, and by determining quality information for various calibration parameters with respect to each of these combinations (e.g., link models), the configuration platform can sort the calibration parameters from best to worst with respect to each link model that a user may encounter when implementing an analyzer device in networks.

The identification information associated with the host devices and the target devices may include serial numbers, model numbers, model names, model types, and/or the like associated with the host devices and the target devices. The lengths of the links may include information identifying physical lengths of the links (e.g., in centimeters, meters, kilometers, inches, feet, miles, and/or the like). The identification information associated with the links may include link types, link names, and/or the like associated with the links. The host device calibration parameters may include calibration parameters or presets (e.g., host equalization presets) for the host devices. The target device calibration parameters may include calibration parameters or presets (e.g., target equalization presets) for the target devices. The quality indicators associated with the host device calibration parameters may include information indicating link qualities (e.g., percentages, high qualities, medium qualities, low qualities, and/or the like) for the host device calibration parameters, as described elsewhere herein. The quality indicators associated with the target device calibration parameters may include information indicating link qualities (e.g., percentages, high qualities, medium qualities, low qualities, and/or the like) for the target device calibration parameters, as described elsewhere herein.

In some implementations, the configuration platform may compare the network information, received from the analyzer device, and the historical calibration information in order to identify calibration information for the analyzer device. For example, the configuration platform may compare network information 1 and the historical calibration information, and identify calibration information for analyzer device 1 based on the comparison. In this example, the configuration platform may identify calibration information associated with the host device (e.g., Preset 1, Preset 4, Preset 6, and Preset 2) since the host device is associated with this calibration information, and may identify calibration information associated with the target device (e.g., Preset 8, Preset 12, Preset 15, and Preset 20) since the target device is associated with this calibration information.

As further shown in FIG. 1D, the configuration platform may rank the identified calibration information based on the quality indicators associated with the host device calibration parameters and the target device calibration parameters. For example, the configuration platform may rank the calibration information associated with the host device in the order Preset 1, Preset 6, Preset 4, and Preset 2 based on the quality indicators associated with the host device calibration parameters (e.g., which indicate a quality of 99% for Preset 1, 91% for Preset 6, 87% for Preset 2, and 50% for Preset 2). The configuration platform may rank the calibration information associated with the target device in the order Preset 12, Preset 8, Preset 15, and Preset 20 based on the quality indicators associated with the target device calibration parameters (e.g., which indicate a quality of 97% for Preset 12, 88% for Preset 8, 74% for Preset 15, and 65% for Preset 20). Although a few possible calibration presets are shown in FIG. 1D, in some implementations there could be hundreds, thousands, or more possible calibration presets that would make manual calibration and selection of calibration presets impossible for a human actor.

In some implementations, by ranking the identified calibration information based on the quality indicators, the configuration platform enables an analyzer device to display the corresponding calibration presets in an ordered list based on the ranking, from best to worst quality. This allows a user of the analyzer device to quickly identify and select the presets likely to produce the best calibration (e.g., from the top of the list), without having to invoke more presets than needed, perform unnecessary host device and target device reboots, and/or the like. In this way, the user can quickly select the most suitable preset for the particular link model for which the analyzer device is being calibrated, thereby conserving resources that would otherwise be used to analyze the calibration information to make a selection.

Figure 1E:
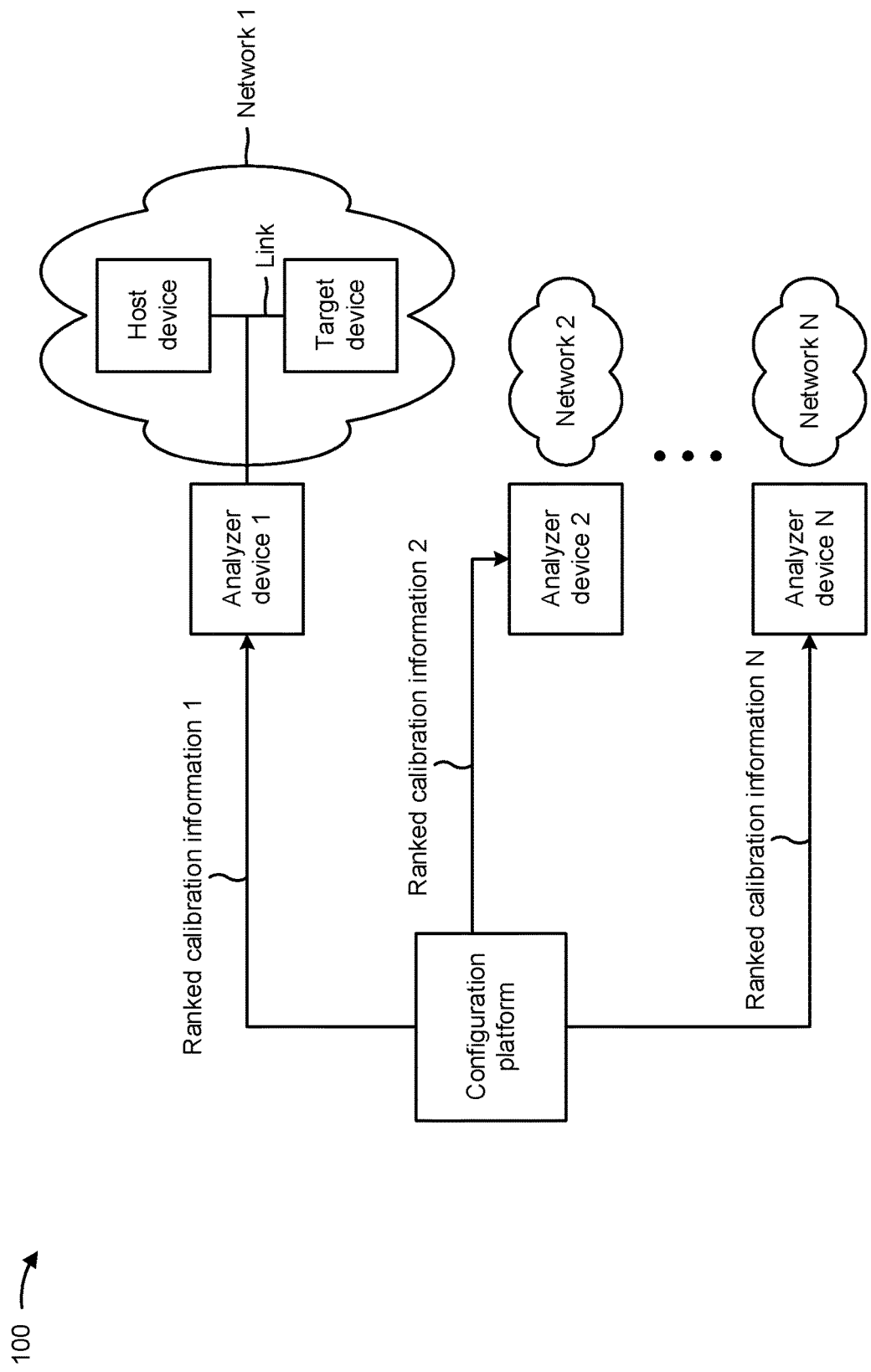

As shown in FIG. 1E, the configuration platform may provide ranked calibration information, as determined in connection with FIG. 1D, to the analyzer devices, and the analyzer devices may receive the ranked calibration information. For example, the configuration platform may provide ranked calibration information 1 to analyzer device 1, may provide ranked calibration information 2 to analyzer device 2, . . . , and may provide ranked calibration information N to analyzer N. In this example, ranked calibration information 1 may include the ranked calibration information associated with the host device (e.g., in the order Preset 1, Preset 6, Preset 4, and Preset 2) and the ranked calibration information associated with the target device (e.g., in the order Preset 12, Preset 8, Preset 15, and Preset 20).

Figure 1F:
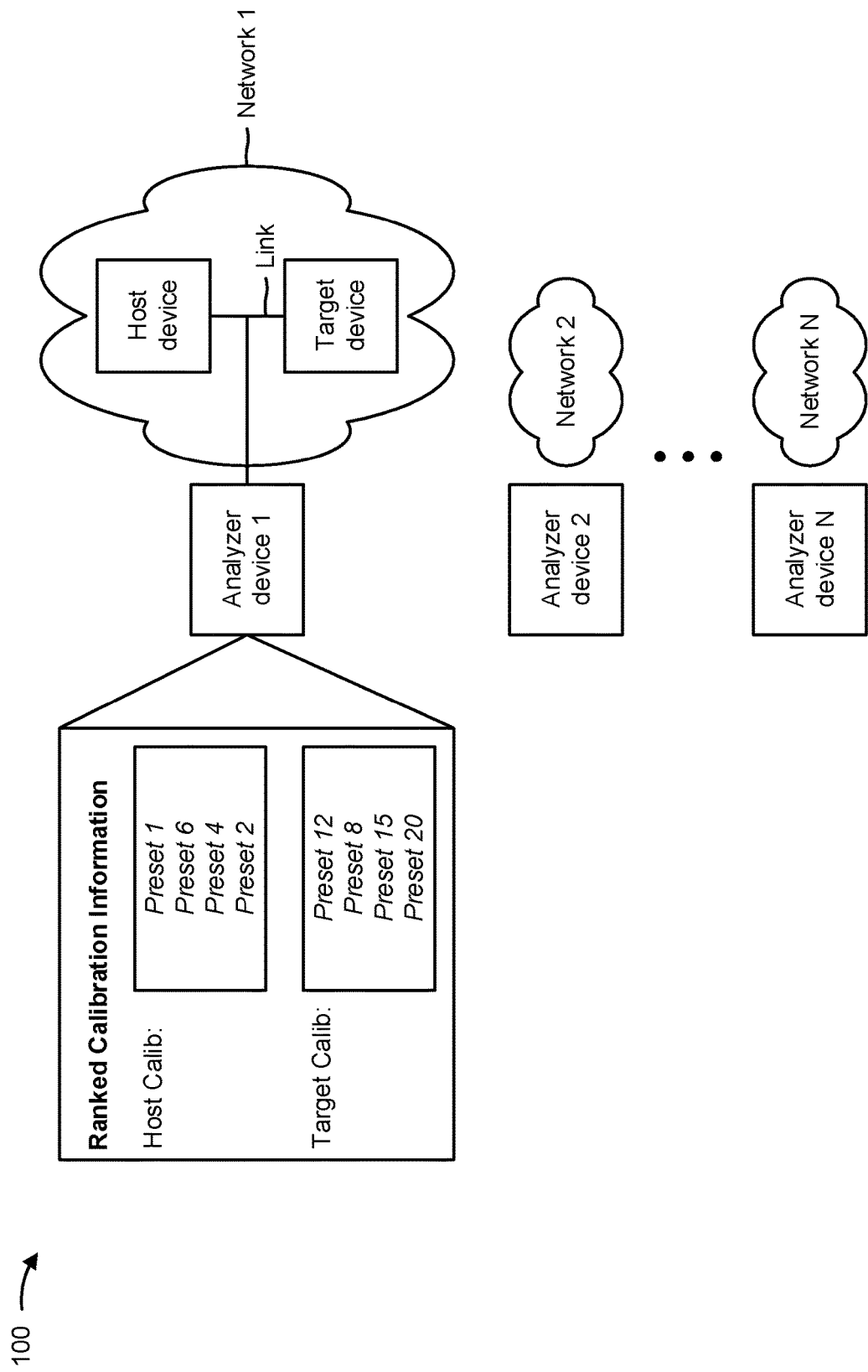

As shown in FIG. 1F, analyzer device 1 may provide a user interface that displays the ranked calibration information 1 to the user of analyzer device 1. The displayed information may include the calibration information associated with the host device ranked in the order Preset 1, Preset 6, Preset 4, and Preset 2, and the calibration information associated with the target device ranked in the order, Preset 12, Preset 8, Preset 15, and Preset 20. The user may select one of the presets from each of the calibration information associated with the host device and the calibration information associated with the target device. For example, assume that the user selects Preset 1 for the host device and Preset 12 for the target device. Based on this selection, analyzer device 1 may implement Preset 1 and Preset 12 in both directions of the link between the host device and the target device so they can communicate error-free through analyzer device 1. If the selected presets enable an error-free link between the host device and target device with analyzer device 1, analyzer device 1 may capture, monitor, and modify the traffic on the link. Similarly, analyzer device 2, . . . , analyzer device N may be utilized to select calibration information (e.g., calibration presets). In some implementations, the configuration platform may provide the best calibration presets to analyzer device 1, and analyzer device 1 may automatically utilize the best calibration presets in order to calibrate itself. In some implementations, the configuration platform may provide the ranked calibration presets to analyzer device 1, and analyzer device 1 may automatically select calibration presets from the ranked calibration presets in order to calibrate itself.

In some implementations, analyzer device 1 may provide a user interface that displays a host device calibration parameter drop-down menu that includes a ranked list of calibration parameters for the host device from which the user may identify and select the host device calibration parameter. Similarly, the user interface may display a target device calibration parameter drop-down menu that includes a ranked list of calibration parameters for the target device from which the user may identify and select the target device calibration parameter.

Figure 1G:
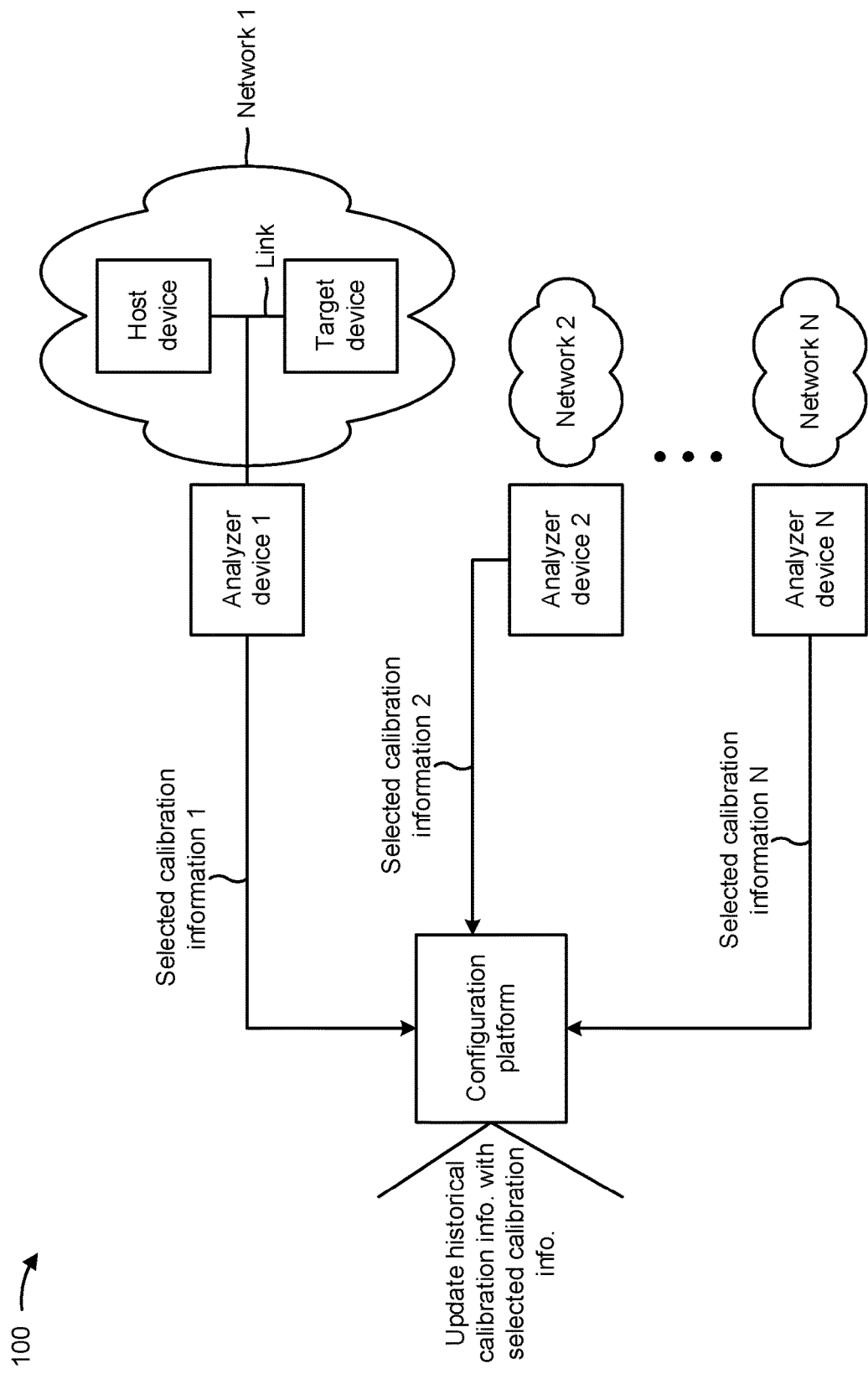

As shown in FIG. 1G, the analyzer devices may provide selected calibration information to the configuration platform. As described above, when the user of analyzer device 1 selects Preset 1 for the host device and Preset 12 for the target device, analyzer device 1 may provide selected calibration information 1 to the configuration platform. Selected calibration information 1 may include information identifying Preset 1 for the host device and Preset 12 for the target device. Analyzer device 2, . . . , analyzer device N may similarly provide selected calibration information 2, . . . , selected calibration information N to the configuration platform. As further shown in FIG. 1G, the configuration platform may update the historical calibration information (shown in FIG. 1D) with the selected calibration information.

Some implementations, described herein, improve performance of an analyzer device by enabling the analyzer device to be quickly calibrated to enable reading, forwarding, and modifying traffic between a host device and a target device on an error-free link associated with a network. Further, some implementations enable an analyzer device to conserve resources (e.g., processor resource, memory resources, and/or the like) since the host device and the target device will not need to continuously reboot to test calibration information (e.g., calibration presets), instead it quickly identifies calibration information to communicate with the host device, with the target device, via the link, and/or the like.

As indicated above, FIGS. 1A-1G are provided merely as an example. Other examples are possible and may differ from what was described with regard to FIGS. 1A-1G.

Figure 2:
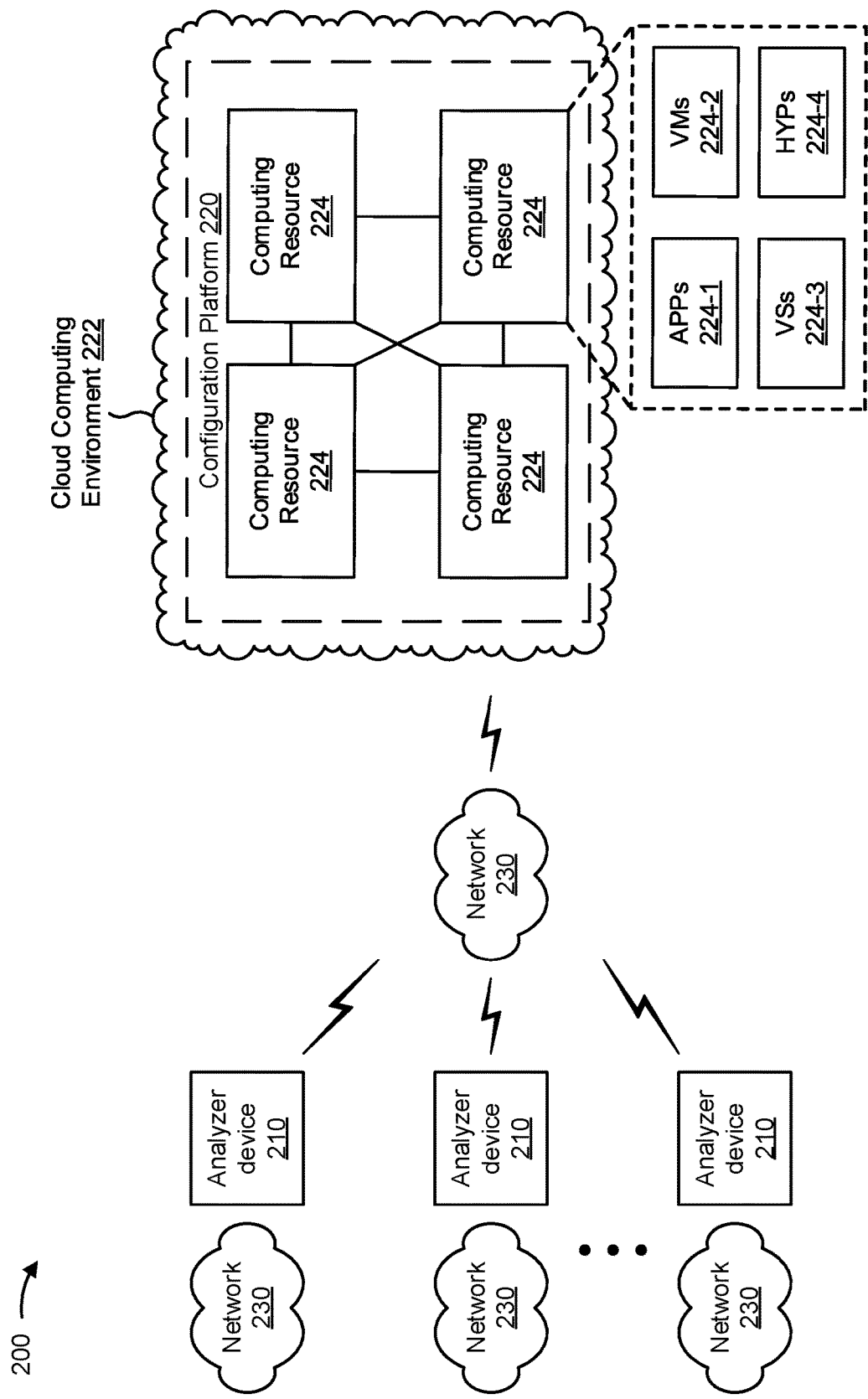
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include multiple analyzer devices 210, a configuration platform 220, and multiple networks 230. Devices of environment 200 may interconnect via wired connections, wireless connections, or a combination of wired and wireless connections.

Analyzer device 210 includes one or more devices capable of receiving, generating, storing, processing, and/or providing information, such as information described herein. For example, analyzer device 210 may include a computing device that is capable of monitoring, analyzing, and modifying traffic, and testing components of network 230 (e.g., network devices, such as a host device, a target device, and/or the like) and links interconnecting the components of network 230. In some implementations, analyzer device 210 may receive information from and/or transmit information to configuration platform 220. In some implementations, analyzer device 210 may be associated with a user device, such as a mobile phone (e.g., a smart phone, a radiotelephone, etc.), a laptop computer, a tablet computer, a handheld computer, a gaming device, a wearable communication device (e.g., a smart wristwatch, a pair of smart eyeglasses, etc.), a Global Positioning Satellite (GPS) device, or a similar type of device.

Configuration platform 220 includes one or more devices that enable analyzer devices 210 to be quickly calibrated for communication with a host device, with a target device, and via a link associated with network 230. In some implementations, configuration platform 220 may be designed to be modular such that certain software components may be swapped in or out depending on a particular need. As such, configuration platform 220 may be easily and/or quickly reconfigured for different uses. In some implementations, configuration platform 220 may receive information from and/or transmit information to one or more analyzer devices 210.

In some implementations, as shown, configuration platform 220 may be hosted in a cloud computing environment 222. Notably, while implementations described herein describe configuration platform 220 as being hosted in cloud computing environment 222, in some implementations, configuration platform 220 may not be cloud-based (i.e., may be implemented outside of a cloud computing environment) or may be partially cloud-based.

Cloud computing environment 222 includes an environment that hosts configuration platform 220. Cloud computing environment 222 may provide computation, software, data access, storage, etc. services that do not require end-user knowledge of a physical location and configuration of system(s) and/or device(s) that hosts configuration platform 220. As shown, cloud computing environment 222 may include a group of computing resources 224 (referred to collectively as "computing resources 224" and individually as "computing resource 224").

Computing resource 224 includes one or more personal computers, workstation computers, server devices, or other types of computation and/or communication devices. In some implementations, computing resource 224 may host configuration platform 220. The cloud resources may include compute instances executing in computing resource 224, storage devices provided in computing resource 224, data transfer devices provided by computing resource 224, etc. In some implementations, computing resource 224 may communicate with other computing resources 224 via wired connections, wireless connections, or a combination of wired and wireless connections.

As further shown in FIG. 2, computing resource 224 includes a group of cloud resources, such as one or more applications ("APPs") 224-1, one or more virtual machines ("VMs") 224-2, virtualized storage ("VSs") 224-3, one or more hypervisors ("HYPs") 224-4, and/or the like.

Application 224-1 includes one or more software applications that may be provided to or accessed by analyzer device 210. Application 224-1 may eliminate a need to install and execute the software applications on analyzer device 210. For example, application 224-1 may include software associated with configuration platform 220 and/or any other software capable of being provided via cloud computing environment 222. In some implementations, one application 224-1 may send/receive information to/from one or more other applications 224-1, via virtual machine 224-2.

Virtual machine 224-2 includes a software implementation of a machine (e.g., a computer) that executes programs like a physical machine. Virtual machine 224-2 may be either a system virtual machine or a process virtual machine, depending upon use and degree of correspondence to any real machine by virtual machine 224-2. A system virtual machine may provide a complete system platform that supports execution of a complete operating system ("OS"). A process virtual machine may execute a single program, and may support a single process. In some implementations, virtual machine 224-2 may execute on behalf of a user (e.g., analyzer device 210 or an operator of configuration platform 220), and may manage infrastructure of cloud computing environment 222, such as data management, synchronization, or long-duration data transfers.

Virtualized storage 224-3 includes one or more storage systems and/or one or more devices that use virtualization techniques within the storage systems or devices of computing resource 224. In some implementations, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

Hypervisor 224-4 may provide hardware virtualization techniques that allow multiple operating systems (e.g., "guest operating systems") to execute concurrently on a host computer, such as computing resource 224. Hypervisor 224-4 may present a virtual operating platform to the guest operating systems, and may manage the execution of the guest operating systems. Multiple instances of a variety of operating systems may share virtualized hardware resources.

Network 230 includes one or more wired and/or wireless networks. For example, network 230 may include a cellular network (e.g., a fifth generation (5G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, and/or the like, and/or a combination of these or other types of networks.

In some implementations, network 230 may include multiple interconnected network devices (not shown in FIG. 2), such as a host device and a target device interconnected via a link. Each of the host device and the target device may include a network device capable of receiving, transmitting, processing, routing, and/or the like, information (e.g., packets) via network 230. In some implementations, each of the host device and the target device may include a router, a switch, a gateway, a modem, a firewall device, a network interface controller (NIC), a hub, a bridge, a proxy server, an optical add-drop multiplexer (OADM), one or more virtual machines executing on one or more computing devices in a cloud computing environment, one or more computing devices in a cloud computing environment, or another type of network device. The link may include a wired link, a wireless link, and/or the like.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
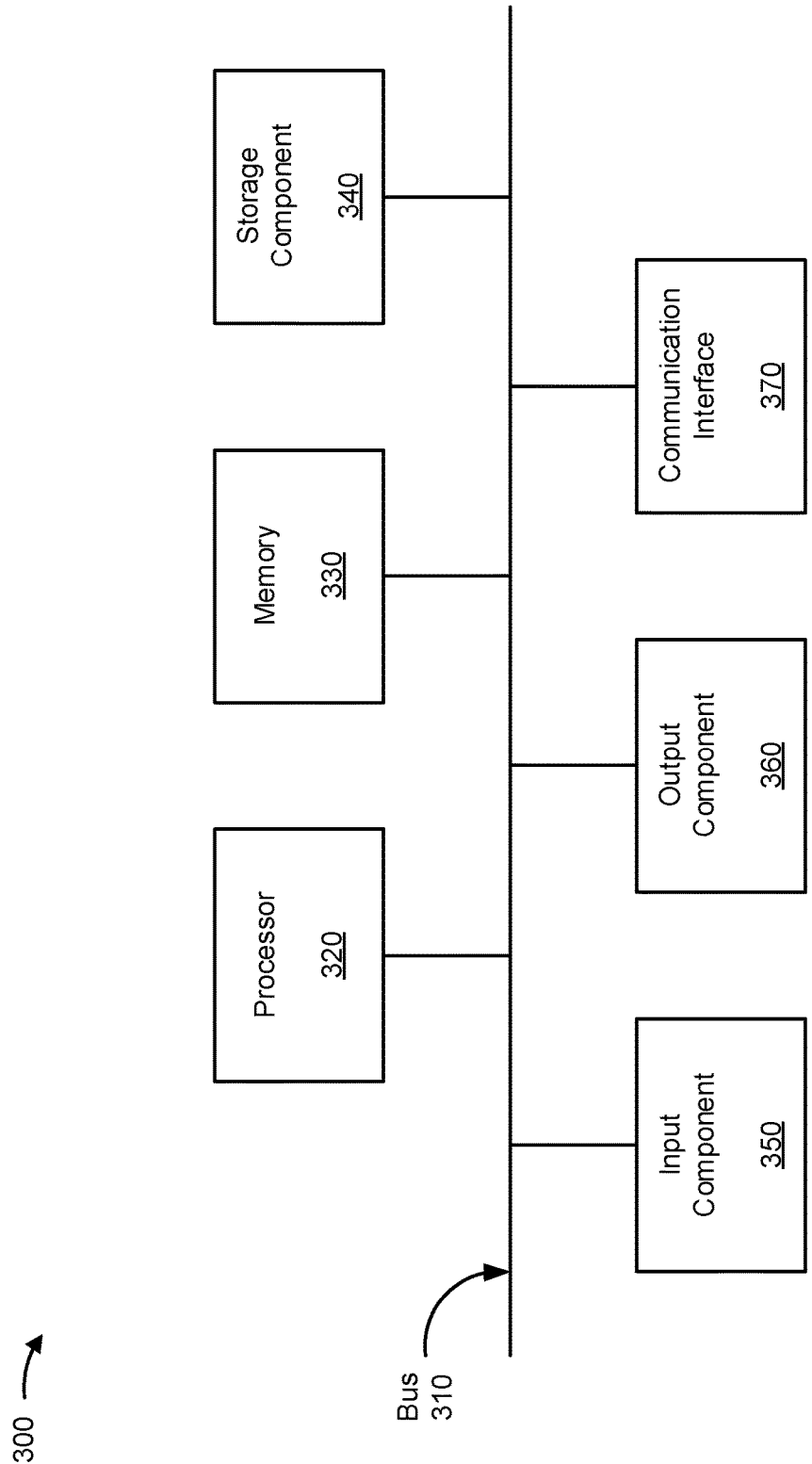
FIG. 3 is a diagram of example components of one or more devices of FIG. 2.

FIG. 3 is a diagram of example components of a device 300. Device 300 may correspond to analyzer device 210, configuration platform 220, and/or computing resource 224. In some implementations, analyzer device 210, configuration platform 220, and/or computing resource 224 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 takes the form of a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIG. 4 is a flow chart of an example process 400 for calibrating network analyzer devices. In some implementations, one or more process blocks of FIG. 4 may be performed by configuration platform 220. In some implementations, one or more process blocks of FIG. 4 may be performed by another device or a group of devices separate from or including configuration platform 220, such as analyzer device 210.

As shown in FIG. 4, process 400 may include receiving and storing historical calibration information associated with host devices, target devices, and links in networks (block 410). For example, configuration platform 220 may receive and store historical calibration information associated with host devices, target devices, and links in networks 230. In some implementations, the historical calibration information may be received from a variety of sources. For example, the historical calibration information may be received from manufacturers associated with the host devices, the target, devices, the links, and/or the like of networks 230, may be received from analyzer devices 210 that have been previously implemented in networks 230, may be received based on tests performed on the host devices, the target devices, the links and/or the like, and/or the like.

In some implementations, the historical calibration information may include link models, identification information associated with host devices of networks 230, identification information associated with target devices of networks 230, lengths of links between the host devices and the target devices, identification information associated with the links, host device calibration parameters, quality indicators associated with the host device calibration parameters, target device calibration parameters, quality indicators associated with the target device calibration parameters, and/or the like.

As further shown in FIG. 4, process 400 may include receiving network information from an analyzer device associated with a network host device, target device, and link (block 420). For example, configuration platform 220 may receive network information from analyzer device 210 that is associated with a host device, a target device, and a link of network 230. In some implementations, the network information may include thousands, millions, billions, or more data points relating to multiple host devices, multiple target devices, multiple links, and multiple networks. In some implementations, a user of analyzer device 210 may input some (or all) of the network information associated with network 230 into analyzer device 210. For example, analyzer device 210 may provide, for display, a user interface that enables the user to enter identification information associated with the host device, identification information associated with the target device, a length of the link, identification information associated with the link, and/or the like. Analyzer device 210 may provide the inputted network information to configuration platform 220, and configuration platform 220 may receive the network information.

As a particular example, analyzer device 210 may provide a user interface that displays a host device drop-down menu that includes a list of devices from which the user may identify and select the host device. If a host device is not included in the host device drop-down menu, the user may add the host device for publication by configuration platform 220, so that the host device will be available for selection thereafter by the user and/or other users of analyzer devices 210. Similarly, the user interface may display a target device drop-down menu that includes a list of devices from which the user may identify and select the target device. If a target device is not included in the target device drop-down menu, the user may add the target device for publication by configuration platform 220, so that the target device will be available for selection thereafter by the user and/or other users of analyzer devices 210.

In some implementations, when the host device, target device, and/or link characteristic change while analyzer device 210 is forwarding and reading traffic, analyzer device 210 may automatically detect the change and may request the user to re-input the link model (e.g., the information associated with the host device, the target device, and the link) to the analyzer device 210. In some implementations, analyzer device 210 may request the user to input the link model every time analyzer device 210 is rebooted, or when analyzer device 210 is disconnected and reconnected to a link.

In some implementations, where users manually enter information associated with host devices, target devices, and links, configuration platform 220 may validate that the entered information is correct. In some implementations, the analyzer device may be able to determine the host device model and the target device model by analyzing the messages exchanged between the two. In some implementations, configuration platform 220 may determine a quantity of times where the user selected the best calibration preset for a link model. If the quantity of times is high, configuration platform 220 may determine that the link model is appropriately input by the user. If the quantity of times is low, configuration platform 220 may determine that the link model is not appropriately input by the user. In such instances, configuration platform 220 may delete the user-inputted link model, and may request the user to re-input another link model. Analyzer device 210 may provide, for display, a message indicating that the link model will be deleted, and requesting that the users input a new link model.

As further shown in FIG. 4, process 400 may include comparing the network information and the historical calibration information to identify a set of calibration information (block 430). For example, configuration platform 220 may compare the network information and the historical calibration information to identify a set of calibration information. In some implementations, configuration platform 220 may compare the network information and the historical calibration information, may identify calibration information (e.g., all calibration presets) associated with the host device identified in the network information, and may identify calibration information (e.g., all calibration presets) associated with the target device identified in the network information. For example, configuration platform 220 may determine matches between the host device identified in the network information and information identifying the host device in the historical calibration information. Any calibration presets associated with the matching host device in the historical calibration information may then be identified by configuration platform 220. Configuration platform 220 may determine matches between the target device identified in the network information and information identifying the target device in the historical calibration information. Any calibration presets associated with the matching target device in the historical calibration information may then be identified by configuration platform 220.

In some implementations, configuration platform 220 may determine matches between the combination of the host device and the target device, identified in the network information, and information identifying the combination of the host device and the target device in the historical calibration information. Any calibration presets associated with the matching combination of the host device and the target device in the historical calibration information may then be identified by configuration platform 220.

As further shown in FIG. 4, process 400 may include ranking the set of calibration information, based on quality information associated with the historical calibration information, to generate a ranked set of calibration information (block 440). For example, configuration platform 220 may rank the set of calibration information, based on quality information associated with the historical calibration information, to generate a ranked set of calibration information. In some implementations, configuration platform 220 may rank the calibration information associated with the host device based on the quality indicators associated with the host devices, and may rank the calibration information associated with the target device based on the quality indicators associated with the target devices, as described elsewhere herein. In some implementations, configuration platform 220 may rank the calibration information associated with the combination of the host device and the target device based on the quality indicators associated with the host devices and the target devices.

In some implementations, if historical calibration information exists for a same link model (e.g., a same combination of host device, target device, link type, and link length) as the network information provided by analyzer device 210, configuration platform 220 may identify and rank the calibration information for the same link model. For example, if historical calibration information exists for a same link model, configuration platform 220 may identify and rank the calibration information associated with the host device based on the quality indicators associated with the host device in the same link model, and may identify and rank the calibration information associated with the target device based on the quality indicators associated with the target device in the same link model.

In some implementations, if historical calibration information does not exist for a same link model as the network information provided by analyzer device 210, then configuration platform 220 may identify and rank the calibration information (e.g., calibration presets) for all link models. In some implementations, if historical calibration information exists for link models having some but not all of the same information as the network information provided (e.g., where the link models have a same host device and target device but a different link type and link length, or where no link type or link length was entered by the user), configuration platform 220 may identify and rank the calibration information for those link models, regardless of the link type or link length.

In some implementations, configuration platform 220 may rank the calibration parameters or presets associated with identified link models and/or order the calibration parameters or presets from best to worst (e.g., in terms of calibration accuracy, effectiveness, etc.). In this way, when a user is presented with the calibration parameters or presets, the user may quickly isolate which parameter or preset is the most suitable for the particular link model to be calibrated. If the user is unable to quickly find a suitable parameter or preset for calibration of analyzer device 210 (e.g., because historical calibration information for a similar link model does not exist), the user may select a best matching parameter or preset to calibrate analyzer device 210, and analyzer device 210 may provide the network information and calibration results to configuration platform 220 after calibration is completed. Configuration platform 220 may use the received network information and calibration results as historical calibration information, which may allow future users to quickly find a suitable parameter or preset when performing calibration.

In some implementations, analyzer device 210 may not have network access to configuration platform 220 when a calibration is to be performed. For example, analyzer device 210 may be provided at a location behind a firewall. In this case, configuration platform 220 may provide historical calibration information for download by analyzer device 210, or by a device associated with analyzer device 210, prior to when the calibration is to be performed. Analyzer device 210, or the device associated with analyzer device 210, may utilize the downloaded historical calibration information when performing the calibration. In this case, analyzer device 210 may determine calibration information for analyzer device 210 based on the historical calibration information, and may provide the determined calibration information to configuration platform 220 when analyzer device 210 has network access to configuration platform 220.

In some implementations, configuration platform 220 may determine quality information for the historical calibration information (e.g., quality information associated with parameters or presets used in calibrating analyzer devices 210) by continuously evaluating calibration parameters that are affected by tuning of analyzer devices 210. In some implementations, configuration platform 220 may determine a first quantity of time that a calibration parameter satisfies a first threshold (e.g., a green time), may determine a second quantity of time that the calibration parameter satisfies a second threshold (e.g., yellow time) that is not as high as the first threshold, and may determine a third quantity of time that the calibration parameter satisfies a third threshold (e.g., a red time) that is not as high as the second threshold. In this case, configuration platform 220 may assign a higher rank to a calibration parameter that is associated with a longer period of time during which performance satisfied the first threshold, than to a calibration parameter that is associated with a shorter period of time during which performance satisfied the first threshold. Configuration platform 220 may similarly rank calibration parameters associated with the second threshold and the third threshold. In some implementations, configuration platform 220 may determine quality information for calibration parameters that satisfy a threshold, and may discard historical calibration information for calibration parameters that do not satisfy a threshold, such as calibration parameters or presets that do not satisfy either the first threshold or the second threshold described above.

In some implementations, configuration platform 220 may determine quality information for the historical calibration information based on a ranking scheme (e.g., which ranks calibration parameters between 0.0 and 6.0, with 6.0 being a best rank, and 0.0 being a poorest rank). In such a ranking scheme, for example, a rank from 5.0 to 6.0 may indicate that a calibration parameter associated with a link model satisfies the first threshold (e.g., the green time) for a period of time (e.g., between twelve seconds and one year). A rank from 4.0 to 4.9 may indicate that a calibration parameter associated with a link model satisfies the second threshold (e.g., the yellow time) for the period of time. A rank from 3.0 to 3.9 may indicate that a calibration parameter associated with the host device or the target device satisfies the first threshold for the period of time. A rank from 2.0 to 2.9 may indicate that a calibration parameter associated with the host device or the target device satisfies the second threshold for the period of time. A rank from 1.0 to 1.9 may indicate that a calibration parameter satisfies the first threshold for the period of time and for all link models. A rank from 0.1 to 0.9 may indicate that a calibration parameter satisfies the second threshold for the period of time and for all link models. A rank of 0.0 may indicate that a calibration parameter does not satisfy the first threshold or the second threshold for the period of time. Finally, a rank of "unknown" may indicate that a calibration parameter was not tested.

As further shown in FIG. 4, process 400 may include providing the ranked set of calibration information to the analyzer device (block 450). For example, configuration platform 220 may provide the ranked set of calibration information (e.g., a ranked list of calibration presets) to analyzer device 210. In some implementations, configuration platform 220 may provide, to analyzer device 210, the ranked calibration information associated with the host device, and the ranked calibration information associated with the target device. In some implementations, analyzer device 210 may provide, for display (e.g., via a user interface), the calibration information associated with the host device in a ranked order, and the calibration information associated with the target device in a ranked order, as described above in connection with FIG. 1F. In some implementations, configuration platform 220 may select one of the calibration presets from each of the ranked calibration information associated with the host device and the ranked calibration information associated with the target device, and may provide the selected calibration presets to analyzer device 210. In such implementations, analyzer 210 may automatically utilize the selected calibration presets without requiring a user to select calibration presets.

As further shown in FIG. 4, process 400 may include receiving, from the analyzer device, selected calibration information of the ranked set of calibration information (block 460). For example, a user of analyzer device 210 may select one of the calibration presets from each of the ranked calibration information associated with the host device and the ranked calibration information associated with the target device. Based on this selection, analyzer device 210 may provide the selected calibration information (e.g., information identifying the selected calibration presets for the host device and the target device) to configuration platform 220. In some implementations, analyzer device 210 may automatically select the best calibration presets for the host device, the target device, and/or the link associated with analyzer device 210. However, if the link model provided by analyzer device 210 is unknown to configuration platform 220, the user of analyzer device 210 may be asked to select from calibration presets recommended by configuration platform 220. In some implementations, analyzer device 210 may utilize the selected calibration presets in order to calibrate itself.

In some implementations, configuration platform 220 may make the selected calibration information or a portion of the selected calibration information (e.g., received from analyzer device 210) publicly available. In some implementations, configuration platform 220 may make the selected calibration information publicly available by default, but may permit a user of analyzer device 210 to mark the selected calibration information as private (e.g., not publicly available). In such implementations, configuration platform 220 may not store the selected calibration information, and may not make the selected calibration information publically available to other analyzer devices 210.

In some implementations, when the user elects to make the selected calibration information private, configuration platform 220 and/or analyzer device 210 may periodically cause a user interface of analyzer device 210 to prompt the user to elect whether to make the selected calibration information public or to keep the selected calibration information private (e.g., until prompted again in the future).

Additionally, or alternatively, if the private selected calibration information includes a particular calibration parameter that configuration platform 220 ranks higher than a public calibration parameter (e.g., a best public calibration parameter for a same link model), configuration platform 220 and/or analyzer device 210 may prompt the user to elect whether to make the particular calibration parameter public or to keep the particular calibration private.

In some implementations, configuration platform 220 may prevent access to configuration platform 220 by unauthorized devices and/or may limit access to a defined set or class of applications and/or devices (e.g., analyzer devices 210). In some implementations, configuration platform 220 may limit access to configuration platform 220 from a secure communication mechanism (e.g., only encrypted information received from analyzer devices 210). In some implementations, configuration platform 220 may securely receive information from and provide information to (e.g., historical calibration information, network information, and/or the like) analyzer devices 210. For example, configuration platform 220 may encrypt files containing calibration parameters, and may validate information (e.g., historical calibration information, calibration parameters, and/or the like) before making the information accessible to analyzer devices 210.

In some implementations, configuration platform 220 may prevent deletion, or immediate deletion, of network information, historical calibration information (e.g., calibration parameters), and/or the like. In some implementations, configuration platform 220 may automatically delete network information, historical calibration information, and/or the like after a threshold amount of time (e.g., a predetermined number of days) is satisfied. In some implementations, configuration platform 220 may make some network information or historical calibration information accessible to some analyzer devices 210 in read-only format.

In some implementations, configuration platform 220 may restrict access to a limited number of analyzer devices 210 at a particular time. In this way, configuration platform 220 may prevent and/or reduce congestion at configuration platform 220. In such implementations, analyzer devices 210 may store historical calibration information in a local cache, and may utilize the cache instead of accessing configuration platform 220 for the historical calibration information.

As further shown in FIG. 4, process 400 may include updating the historical calibration information based on the selected calibration information (block 470). For example, configuration platform 220 may update the historical calibration information based on the selected calibration information. In some implementations, configuration platform 220 may update the historical calibration information to include the selected calibration information. In some implementations, configuration platform 220 may update the historical calibration information to include a portion of the selected calibration information.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Some implementations, described herein, provide a calibration platform that calibrates network analyzer devices quickly and easily based on historical calibration information. The calibration platform may receive calibration information from analyzer devices associated with different host devices, target devices, and link configurations, and may store the received information as historical calibration information. The calibration platform may utilize the historical calibration information to provide ranked calibration information to an analyzer device, and a user of the analyzer device may quickly select and calibrate the analyzer device based on the ranked calibration information.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, and/or the like.

Certain user interfaces have been described herein and/or shown in the figures. A user interface can include a graphical user interface, a non-graphical user interface, a text-based user interface, or the like. A user interface can provide information for display. In some implementations, a user can interact with the information, such as by providing input via an input component of a device that provides the user interface for display. In some implementations, a user interface can be configurable by a device and/or a user (e.g., a user can change the size of the user interface, information provided via the user interface, a position of information provided via the user interface, etc.). Additionally, or alternatively, a user interface can be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, and/or the like), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A device, comprising:
one or more processors to:
receive network information from an analyzer device associated with a host device, a target device, and a link of a network;
compare the network information and historical equalizer calibration information to identify a set of equalizer calibration information,
the historical equalizer calibration information being associated with a plurality of host devices, a plurality of target devices, and a plurality of links;
rank the set of equalizer calibration information, based on quality information associated with the historical equalizer calibration information, to generate a ranked set of equalizer calibration information; and
provide the ranked set of equalizer calibration information to the analyzer device to permit the analyzer device to identify selected equalizer calibration information of the ranked set of equalizer calibration information, and utilize the selected equalizer calibration information.

2. The device of claim 1, where the one or more processors are further to:
receive the historical equalizer calibration information from a plurality of analyzer devices associated with the plurality of host devices, the plurality of target devices, and the plurality of links,
the plurality of analyzer devices not including the analyzer device; and
store the historical equalizer calibration information.

3. The device of claim 1, where the one or more processors are further to:
receive, from the analyzer device, the selected equalizer calibration information of the ranked set of equalizer calibration information; and
update the historical equalizer calibration information based on the selected equalizer calibration information.

4. The device of claim 1, where the one or more processors are further to:
provide at least a portion of the historical equalizer calibration information to the analyzer device prior to receiving the network information.

5. The device of claim 1, where the quality information associated with the historical equalizer calibration information includes:
information associating equalizer calibration parameters and quality indicators associated with the plurality of host devices and the plurality of target devices.

6. The device of claim 1, where the ranked set of equalizer calibration information includes:
a ranked set of host device equalizer calibration parameters associated with the plurality of host devices, and
a ranked set of target device equalizer calibration parameters associated with the plurality of target devices.

7. The device of claim 1, where the quality information associated with the historical equalizer calibration information includes:
equalizer calibration parameters associated with the plurality of host devices and the plurality of target devices, and
information identifying a quantity of times each of the equalizer calibration parameters, associated with the plurality of host devices and the plurality of target devices, is selected by a plurality of analyzer devices associated with the plurality of host devices and the plurality of target devices,
the plurality of analyzer devices not including the analyzer device.

8. The device of claim 1, where:
the host device is not included in the plurality of host devices,
the target device is not included in the plurality of target devices, and
the link is not included in the plurality of links.

9. A non-transitory computer-readable medium storing instructions, the instructions comprising:
one or more instructions that, when executed by one or more processors, cause the one or more processors to:
receive network information from an analyzer device associated with a host device, a target device, and a link of a network;
compare the network information and historical equalizer calibration information to identify a set of equalizer calibration information,
the historical equalizer calibration information being associated with a plurality of host devices, a plurality of target devices, and a plurality of links;
rank the set of equalizer calibration information, based on quality information associated with the historical equalizer calibration information, to generate a ranked set of equalizer calibration information; and
provide the ranked set of equalizer calibration information to the analyzer device to permit the analyzer device to identify selected equalizer calibration information of the ranked set of equalizer calibration information, and utilize the selected equalizer calibration information.

10. The non-transitory computer-readable medium of claim 9, where the one or more instructions, when executed by the one or more processors, further cause the one or more processors to:
receive the historical equalizer calibration information from a plurality of analyzer devices associated with the plurality of host devices, the plurality of target devices, and the plurality of links,
the plurality of analyzer devices not including the analyzer device; and
store the historical equalizer calibration information.

11. The non-transitory computer-readable medium of claim 9, where the one or more instructions, when executed by the one or more processors, further cause the one or more processors to:
receive, from the analyzer device, the selected equalizer calibration information of the ranked set of equalizer calibration information; and
update the historical equalizer calibration information based on the selected equalizer calibration information.

12. The non-transitory computer-readable medium of claim 9, where the one or more instructions, when executed by the one or more processors, further cause the one or more processors to:
provide a portion of the historical equalizer calibration information to the analyzer device prior to receiving the network information.

13. The non-transitory computer-readable medium of claim 9, where the quality information associated with the historical equalizer calibration information includes:
 information associating equalizer calibration parameters and quality indicators associated with the plurality of host devices and the plurality of target devices.

14. The non-transitory computer-readable medium of claim 9, where the ranked set of equalizer calibration information includes:
 a ranked set of host device equalizer calibration parameters associated with the plurality of host devices, and
 a ranked set of target device equalizer calibration parameters associated with the plurality of target devices.

15. The non-transitory computer-readable medium of claim 9, where the quality information associated with the historical equalizer calibration information includes:
 equalizer calibration parameters associated with the plurality of host devices and the plurality of target devices, and
 information identifying a quantity of times each of the equalizer calibration parameters, associated with the plurality of host devices and the plurality of target devices, is selected by a plurality of analyzer devices associated with the plurality of host devices and the plurality of target devices,
  the plurality of analyzer devices not including the analyzer device.

16. The non-transitory computer-readable medium of claim 9, where:
 the host device is not included in the plurality of host devices,
 the target device is not included in the plurality of target devices, and
 the link is not included in the plurality of links.

17. A method, comprising:
 receiving, by a device, network information from an analyzer device associated with a host device, a target device, and a link of a network;
 comparing, by the device, the network information and historical equalizer calibration information to identify a set of equalizer calibration information,
  the historical equalizer calibration information being associated with a plurality of host devices, a plurality of target devices, and a plurality of links;
 ranking, by the device, the set of equalizer calibration information, based on quality information associated with the historical equalizer calibration information, to generate a ranked set of equalizer calibration information; and
 providing, by the device, the ranked set of equalizer calibration information to the analyzer device to permit the analyzer device to identify selected equalizer calibration information of the ranked set of equalizer calibration information, and utilize the selected equalizer calibration information.

18. The method of claim 17, further comprising:
 receiving the historical equalizer calibration information from a plurality of analyzer devices associated with the plurality of host devices, the plurality of target devices, and the plurality of links,
  the plurality of analyzer devices not including the analyzer device; and
 storing the historical equalizer calibration information.

19. The method of claim 17, further comprising:
 receiving, from the analyzer device, the selected equalizer calibration information of the ranked set of equalizer calibration information; and
 updating the historical equalizer calibration information based on the selected equalizer calibration information.

20. The method of claim 17, further comprising:
 providing at least a portion of the historical equalizer calibration information to the analyzer device prior to receiving the network information.

21. The method of claim 17, where the quality information associated with the historical equalizer calibration information includes:
 information associating equalizer calibration parameters and quality indicators associated with the plurality of host devices and the plurality of target devices.

22. The method of claim 17, where the ranked set of equalizer calibration information includes:
 a ranked set of host device equalizer calibration parameters associated with the plurality of host devices, and
 a ranked set of target device equalizer calibration parameters associated with the plurality of target devices.

23. The method of claim 17, where:
 the host device is not included in the plurality of host devices,
 the target device is not included in the plurality of target devices, and
 the link is not included in the plurality of links.

* * * * *